United States Patent [19]

Kraus et al.

[11] Patent Number: 4,896,322

[45] Date of Patent: Jan. 23, 1990

[54] CIRCUIT CONFIGURATION AND A METHOD FOR THE TESTING OF STORAGE CELLS

[75] Inventors: Rainer Kraus, Munich; Oskar Kowarik, Grafing; Kurt Hoffmann, Taufkirchen; Manfred Paul, Unterfoehring, all of Fed. Rep. of Germany

[73] Assignee: Siemens Atkiengesellschaft, Munich, Fed. Rep. of Germany

[21] Appl. No.: 168,676

[22] Filed: Mar. 16, 1988

[30] Foreign Application Priority Data

Mar. 16, 1987 [DE] Fed. Rep. of Germany ....... 3708489

[51] Int. Cl.$^4$ .......................................... G11K 29/00
[52] U.S. Cl. .................................. 371/21.2; 365/200; 365/201
[58] Field of Search ...................... 371/21, 68, 70, 15, 371/24; 365/200, 201

[56] References Cited

U.S. PATENT DOCUMENTS 4,055,754 10/1977 Chesley .
4,685,086 8/1987 Tran ................................ 365/201 X

FOREIGN PATENT DOCUMENTS 0143624 6/1985 European Pat. Off. .

OTHER PUBLICATIONS

Y. You, "A Self-Testing Dynamic RAM Chip", IEEE Transactions on Electronic Devices, vol. 32, No. 2, 2/1985, pp. 508–515.
Patent Abstracts of Japan, vol. 6, No. 188 (P-144), [1066], Sep. 28, 1982; and Japanese 57-100690 (Tokyo Shibaura Denki K. K.), Jun. 22, 1982; Summary.

Primary Examiner—John R. Lastova
Assistant Examiner—Robert W. Beausoliel
Attorney, Agent, or Firm—Herbert L. Lerner; Laurence A. Greenberg

[57] ABSTRACT

In a circuit configuration and a method for testing storage cells, all of the bit lines lead to one pair of fault lines which is first precharged with mutually-complementary logic levels. All of the storage cells of a word line are always read-out in parallel relative to one another. In the event of "no fault" the pair of fault lines retains its logic states, whereas in the case of a fault one of the fault lines changes its logic state through switching transistors. This is recognized and analyzed by a comparator circuit in the form of an XOR-circuit or an XNOR-circuit.

12 Claims, 1 Drawing Sheet

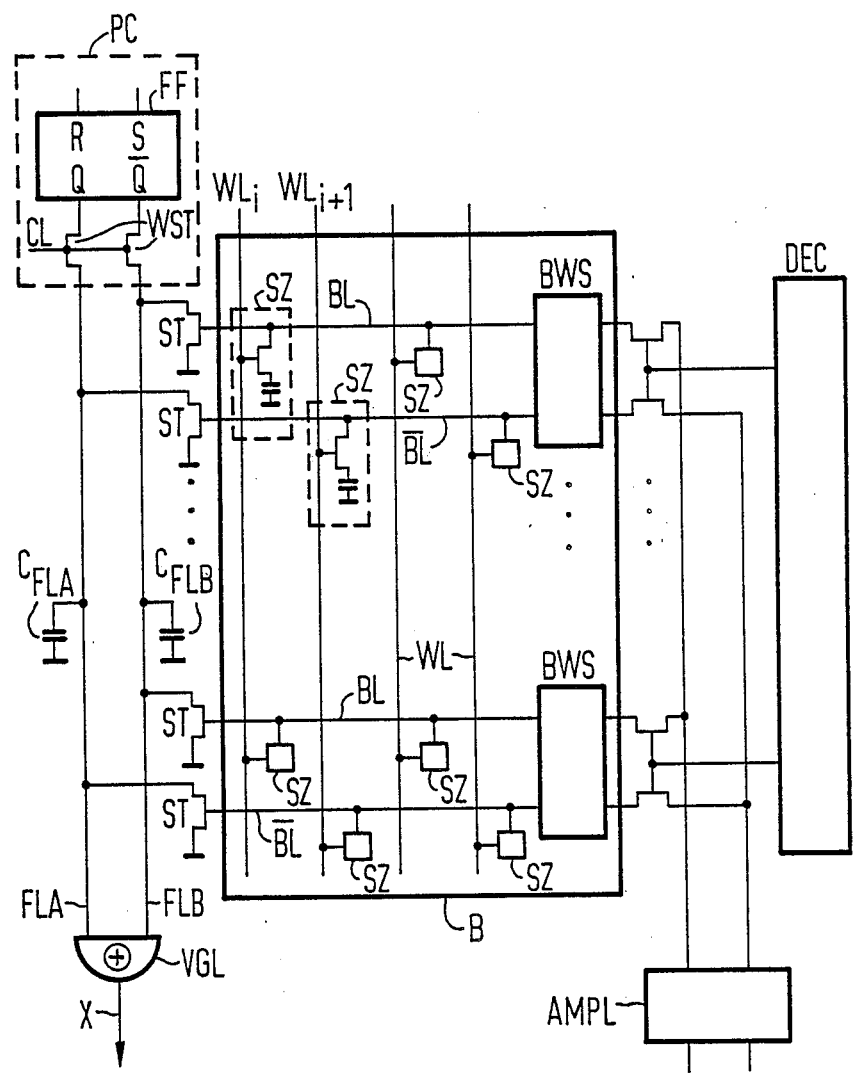

CIRCUIT CONFIGURATION AND A METHOD FOR THE TESTING OF STORAGE CELLS

BACKGROUND OF THE INVENTION

Field of the Invention

The invention relates to a circuit configuration and a method for the testing of storage cells which are disposed in the form of a matrix and which can be driven through word and bit lines, each bit line being assigned an evaluator circuit dividing the bit line into two identical bit line halves.

In recent years the increase in the number of storage cells in a semiconductor memory has led to an enormous lengthening of the test time required to test a semiconductor memory. Whereas, for example, a DRAM with a storage capacity of 4 kB could previously be adequately tested in a test time of 3 to 20 seconds (depending upon the type and number of test patterns used and other test conditions), the test time of a modern 1MB-DRAM is in the order of 20 minutes.

Various measures for shortening the test time have already been disclosed. For example, European Application No. 0 186 040, corresponding to allowed U.S. application Ser. No. 811,932 proposes that a semiconductor memory be internally divided into a plurality of identical blocks and that these blocks be tested in parallel relative to one another. In practice this permits the test time to be reduced to approximately one-quarter to one-eighth of the time previously required.

U.S. Pat. No. 4,055,754 proposes that all of the storage cells of a complete word line be tested in parallel with respect to time, and that a specified analysis circuit within the semiconductor memory be used for this purpose. Despite a substantial reduction in test time, this solution is disadvantageous since it requires an analysis circuit composed of at least three logic gates, two of the gates requiring a number of inputs which is equal to the number of existing word lines. The construction of such a device leads to a very great additional service area requirement, which contradicts the general trend to miniaturize circuits.

It is accordingly an object of the invention to provide a circuit configuration and a method for the testing of storage cells, which overcomes the hereinafore-mentioned disadvantages of the heretofore-known methods and devices of this general type and which permits storage cells to be tested with a short time outlay and a minimum additional surface area requirement.

SUMMARY OF THE INVENTION:

With the foregoing and other objects in view there is provided, in accordance with the invention, a circuit configuration for testing storage cells disposed in a matrix in a semiconductor memory including word and bit lines for driving the storage cells, and evaluator circuits each being assigned to a respective bit line and each dividing the respective bit line into two identical first and second bit line halves, comprising:

a pair of first and second fault lines, a precharging device connected to the pair of fault lines, a comparator circuit having inputs connected to the pair of fault lines and an outlet issuing an output signal indicating the occurrence of faults in test operation, first and second switching transistors having sources, drains and gates, the gates of the first switching transistors each being connected to a respective one of the first bit line halves of the bit lines, and the gates of the second switching transistors each being connected to a respective one of the second bit line halves of the bit lines, the sources of each of the switching transistors being connected to a potential corresponding to one of two mutually-complementary logic levels carried or assumed by the pair of fault lines in test operation, the drains of the second switching transistors being connected the first fault line, and the drains of the first switching transistors being connected to the second fault line.

In accordance with another feature of the invention, the potential connected to the source of each of the switching transistors is equal to a reference potential (ground) of the overall circuit configuration.

In accordance with a further feature of the invention, the potential connected to the source of each of the switching transistors is equal to a supply potential of the overall circuit configuration.

In accordance with an added feature of the invention, the precharging device includes an RS flip-flop circuit having two mutually-complementary outputs, and further switching transistors connected between the outputs of the RS flip-flop circuit and the pair of fault lines.

In accordance with an additional feature of the invention, the comparator circuit is an XOR-circuit or an XNOR-circuit.

With the objects of the invention in view, there is also provided a method of testing storage cells disposed in a matrix in a semiconductor memory including word lines and bit lines for driving the storage cells, and evaluator circuits each dividing a respective one of the bit lines into two identical bit line halves, which comprises: charging all of the storage cells connected to a word line to an equal logic level in test operation; charging or precharging a pair of fault lines to two mutually-complementary logic levels being identical with respect to their significance or importance to logic levels which can be input into the storage cells in the form of electric charges; activating a word line for transferring a charge stored in the storage cells connected to the word line to the respective associated bit line halves; evaluating and amplifying the charges read-out in this manner with the evaluator circuits, and forming logic levels assigned to the read-out charges; driving and switching switching means connected between the bit line halves and the fault lines into conductivity or blocking with the logic levels; retaining the logic state of the two fault lines or changing the logic state of one of the fault lines depending upon the switching characteristics of the switching means; and checking whether or not the fault lines retain the mutually-complementary logic levels impressed by the precharging step upon read-out and evaluation of the charges of the storage cells with a comparator circuit connected to the fault lines.

In accordance with another mode of the invention, there is provided a method which comprises carrying out the precharging step by precharging outputs of an RS flip-flop connected to the fault lines through further switching means, and subsequently disconnecting the outputs of the RS flip-flop from the fault lines with the further switching means.

In accordance with a further mode of the invention, there is provided a method which comprises carrying out the checking or analysis step with an XOR-circuit or an XNOR-circuit forming the comparator circuit.

In accordance with an a concomitant mode of the invention, there is provided a method which comprises assigning the logic levels to the two fault lines in such a way that the fault line connected through the switching means to the storage cells to be tested in a test cycle or case has a logic level complementary or equal to the logic level assigned to the storage cells which are to be tested in the form of stored charges, in the case of "no fault".

Other features which are considered as characteristic for the invention are set forth in the appended claims.

Although the invention is illustrated and described herein as embodied in a circuit configuration and a method for the testing of storage cells, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the drawing.

BRIEF DESCRIPTION OF THE DRAWINGS:

The single drawing is a schematic block diagram of a circuit according to the invention.

DESCRIPTION OF THE PREFERRED EMBODIMENTS:

Referring now to the single figure of the drawing in detail, there is seen a block B with storage cells SZ. The associated semiconductor memory can have one or more blocks B, which constitutes prior art and has therefore not been shown in the drawing for reasons of clarity. The storage cells SZ are disposed in the form of a matrix and can be addressed through word lines WLi, WLi+1, generally referred to as WL, and through bit lines. As is generally known, each bit line is assigned an evaluator circuit BWS.

The evaluator circuit divides the bit line into two at least approximately identical bit line halves BL,$\overline{BL}$. For reasons of symmetry, the two halves are generally exactly identical with respect to the functioning of the evaluator circuit BWS, as far as is technologically possible.

Those skilled in the art will be familiar with two different concepts regarding the configuration of bit lines and evaluator circuits BWS. In the case of the earlier, so-called "open-bit line concept", the two bit line halves are disposed on both sides of evaluator circuits BWS. Thus the evaluator circuits BWS divide the storage cell array of a block B into a left-hand and a right-hand cell array half. In the case of the modern bit line concept, known as the "folded-bit line concept", the two bit line halves are disposed on one single side of the evaluator circuit BWS. Thus in the case of this concept, the evaluator circuits BWS are disposed at the edge of the cell array. The present invention can be implemented in accordance with both bit line concepts.

The evaluator circuits and the storage cells also represent prior art. Evaluator circuits familiar to those skilled in the art contain two transistors which are cross coupled through the gates thereof and which have a common terminal connected to a potential that can generally be switched or that is controllable with respect to the time curve thereof. The free ends of the transistors of the evaluator circuits are each connected to a bit line half BL,$\overline{BL}$. Other embodiments are also conceivable in accordance with the prior art.

The storage cells are likewise constructed in accordance with the prior art. When a DRAM is used as semiconductor memory, the storage cells are generally one-transistor storage cells. The present invention can likewise be applied to static memories (SPAMs) and to programmable memories such as EPROMs and EE-PROMs, without substantial modifications. One-transistor storage cells of a DRAM have been represented in the illustrated embodiment. Regarding the application of the invention, it is irrelevant whether the memory concept provides so-called dummy cells or whether the evaluator circuit operates in accordance with the so-called mid-level concept.

The circuit configuration in accordance with the invention also includes a pair of fault lines FLA, FLB for each block B. For example, one end of each fault line (although any other position is also conceivable) is connected to a precharging device PC which serves to precharge the fault lines FLA, FLB and parasitic capacitances $C_{FLA}$, $C_{FLB}$ to mutually-complementary levels, as will be described below. The pair of fault lines FLA, FLB forms inputs of a comparator circuit VGL. The output of the comparator circuit VGL serves to display the occurrence of a fault in a test situation.

Each bit line half of each bit line BL,$\overline{BL}$ is assigned a switching transistor ST. The gate of each switching transistor ST is connected to the bit line half BL,$\overline{BL}$ to which it is assigned. The sources of all of the switching transistors ST are commonly connected to a potential which corresponds in value to one of the two aforementioned logic levels. These two logic levels are identical in importance or significance to the logic levels which are stored as information in the storage cells during (test) operation, they are fundamentally identical with respect to potential to the levels which occur during the read-out of the information from the storage cells as a result of evaluation and amplification by means of the evaluator circuits, and they are generally identical to supply voltages VDD and VSS.

For each bit line, the drain of the switching transistor ST whose gate is connected to the first bit line half BL is connected to the second fault line FLB, and the drain of the switching transistor ST whose gate is connected to the second bit line half $\overline{BL}$ is connected to the first fault line FLA.

According to an advantageous further development of the invention, the potential connected to the source of each switching transistor ST is equal to the general reference potential of the overall circuit configuration, generally referred to as ground. According to another advantageous further development of the invention, the potential connected to the source of each switching transistor ST is equal to that of the general supply voltage of the overall circuit configuration, often designated by the symbol VDD.

According to one embodiment of the invention, the precharging device PC has an RS flip-flop circuit FF which has two conventional, mutually-complementary outputs Q,$\overline{Q}$.

Each output Q,$\overline{Q}$ is connected through a further switching transistor WST to the pair of fault lines FLA, FLB. The gates of the further switching transistors WST are connected to a clock signal CL which controls the precharging of the fault lines FLA, FLB by the precharging device PC, in a test situation.

According to an advantageous first embodiment, the comparator circuit VGL is an XOR-circuit.

According to an advantageous second embodiment the comparator circuit is an XNOR-circuit.

For a full understanding, it should also be noted that, as is generally the case, the block B of storage cells SZ is driven through column and row decoders, that moreover an external (further) amplifier is provided which can also serve to precharge the bit lines, and that other normally existing circuits, such as e.g. address and data buffers, are also provided. However, these circuits do not relate to the development of the circuit configuration in accordance with the invention. For this reason, and also for reasons of clarity, the figure illustrates only one external amplifier AMPL and a bit line decoder DEC.

The method in accordance with the invention will now be described while making reference to the illustrated advantageous circuit configuration:

In the test situation, all of the storage cells SZ which are connected to a respective word line WL are charged to a logic level which is identical for all of the storage cells SZ connected to the word line WL. The logic level is representative of an item of information which is to be input into the storage cells SZ. The logic level can differ (logical 0 or logical 1) for the individual word lines. It is only important that the same item of information be input into all of the storage cells within a word line.

Thus the selection of the possible test patterns which are to be used is limited to those test patterns in which all of the storage cells of a word line contain the same information. Such test patterns formed, for example, of "All 0s", "All 1s", "Alternating Columns", left-hand half of the storage cell array "All 0s", and right-hand half "All 1s", or vice versa. For example, the "Checkerboard" test pattern in which the information stored in the storage cells of a word line alternates from storage cell to storage cell ('1010'), as is known, is not possible. However, this is entirely adequate for simple function tests, such as an incoming inspection or a rough check as to whether or not the memory is basically functioning. If the storage cells of each word line are tested both with respect to "Information equal to logical 0", and with respect to "Information equal to logical 1", the following faults can always be discovered by the method corresponding to the invention:

(a) the bit line is "clamped" to an (arbitrary) potential;

(b) (at least) one storage cells is "clamped" to an (arbitrary) potential.

The following types of fault can be determined in most cases:

(a) (at least) one bit line decoder and/or word line decoder is operating incorrectly;

(b) (at least) one word line is clamped at an (arbitrary) potential;

(c) (at least) one evaluator circuit is operating incorrectly.

The required test time is not determined, for example, by the number of storage cells SZ (to be tested), as is usually the case, but instead by the number of word lines WL.

The pair of fault lines FLA, FLB are charged to two mutually-complementary logic levels (logical 0, logical 1), either simultaneously with the input into the storage cells SZ or following the input, but before the read-out of the storage cells SZ of a word line. These logic levels are identical with respect to the significance or importance thereof to the logic levels which can be input into the storage cells as information items. For example, as expressed in general terms, the assignment of the logic levels to the two lines of the pair of fault lines FLA, FLB is selected in such a way that in the case of the fault line of the fault lines FLA, FLB, which is connected through switching means to which it is coupled to a bit line half BL,$\overline{BL}$ whose associated storage cells are to be tested, the logic level is complementary to the logic level assigned to these storage cells SZ as information in the form of stored charges.

In a concrete example relating to the circuit configuration in accordance with the invention shown in the drawing, this explanation has the following meaning: It will be assumed that (in the next test cycle) all of the storage cells SZ which are connected to the word line WLi are to be tested. It will also be assumed that a logical 1 is stored as information in the form of electric charges, in these storage cells SZ. These storage cells SZ are all connected to the first bit line halves BL of their assigned bit lines.

Each of these first bit line halves BL of the bit lines drives the gate of a switching transistor ST. The switching transistors ST generally serve as switching means. A control link is provided to the fault line FLB through the switching transistors ST, as already described. The second bit line half $\overline{BL}$ is connected to the first fault line FLA through switching transistors ST which serve as switching means. Since the storage cells SZ which are to be tested will be assumed to have stored a logical 1, the fault line FLB must be precharged to a logical 0. Accordingly, the first fault line FLA must be precharged, in complementary fashion, to a logical 1. In the present example it has been assumed that the switching means, i.e. the switching transistors ST in the embodiment shown in the drawing, are connected at one side (for instance at the source thereof) to the general reference potential ground of the overall circuit configuration.

The precharging itself is carried out by the precharging device PC. In the event that the precharging device PC includes an RS flip-flop FF it is set, for example, in such manner that a logical 1 occurs at its output Q which assigned to the fault line FLA, and a logical 0 occurs at its output $\overline{Q}$ which is assigned to the fault line FLB. In this embodiment the precharging procedure is carried out by means of the further switching transistors WST. For this purpose, as already mentioned above, the further switching transistors WST are switched into conductivity and are then blocked either during or following the input of the information into the storage cells SZ, under the control of the clock signal CL.

Then, under the control of the word line decoder which is not illustrated in the drawing and which can be constructed in accordance with the prior art, one word line, which is the word line WLi in the present example, is activated. Thus in the case of all of the storage cells SZ which are connected to this word line WLi, the stored information is transferred to the bit line half assigned to the respective storage cell, and in the present example is transferred to the first bit line half BL. The electric states of each bit line are then evaluated and amplified by the assigned evaluator circuit BWS in a known manner. As a result, the logic states 0 and 1 occur with levels which distinctly differ from one another electrically on the two bit line halves BL,$\overline{BL}$ of each bit line.

In the present example it has been assumed that a logical 1 is to be read out from the storage cells SZ. If all of the read-out storage cells SZ are in order, a logical 1 occurs on every first bit line half BL and a logical 0 occurs on every second bit line half $\overline{BL}$. Thus all of the switching transistors which are each connected to the first half BL of the bit lines are switched through. In the drawing, the respective sources thereof are connected to ground. This corresponds to a logical 0 which is fed through each of the switched-through switching transistors ST to the fault line FLB. A logical 0 occurs at the first input of the comparator circuit VGL.

However, those switching transistors ST which are each connected to the second bit line half $\overline{BL}$ of a bit line are all blocked because a clearly defined logical 0 is impressed on all of the second bit line halves $\overline{BL}$ of the bit lines by the evaluator circuits. Therefore, the logical 1 impressed on the fault line FLB by the precharging is retained and serves as an input signal at the other input of the comparator circuit VGL. The comparator circuit VGL thus recognizes that different signals occur at the inputs thereof, which signifies "no fault", as indicated by an output signal X thereof.

However, if at least one fault occurs, the two bit line halves BL,$\overline{BL}$ of the bit line affected by the fault assume logic states which differ from those previously described. This means that, in the case of at least one bit line, the switching transistor assigned to the first bit line half BL is blocked and accordingly the switching transistor assigned to the second bit line half $\overline{BL}$ is switched into conductivity. Thus, although the fault line FLB retains its (precharged) state of logical 0, the fault line FLA is switched to logical 0. The comparator circuit VGL is supplied with identical input signals at the inputs thereof, which it analyses as an indication of a fault and accordingly sets the output signal X thereof as a fault signal.

In the embodiment described above, in which the sources of the switching transistors ST are connected to the general supply voltage VDD, when the memory content of the storage cells SZ which are to be tested is identical, the pair of fault lines FLB must be charged in a fashion opposite to that of the previously-described example. The remainder of the operating sequence is identical to that previously described.

It is advantageous to carry out the analysis by the comparator circuit using an XOR or an XNOR-circuit.

On the basis of the foregoing description, those skilled in the art will be able to easily comprehend an example in which a logical 0 is to be read out from the storage cells SZ of a word line WL as an indication of "no fault". Therefore this example will not be described further.

With regard to the generation of special test and control signals, reference is made in particular to co-pending U.S. application Ser. No. 168,668 having the same filing date as the instant application.

With regard to special decoder embodiments, reference is made to co-pending U.S. applications Ser. Nos. 168,652 and 168,672 having the same filing date as the instant application.

We claim:

1. Circuit configuration for testing storage cells disposed in a matrix in a semiconductor memory including word and bit lines for driving the storage cells, and evaluator circuits each being assigned to a respective bit line and each dividing the respective bit line into two identical first and second bit line halves, comprising:
   a pair of first and second fault lines, a precharging device connected to said pair of fault lines, a comparator circuit having inputs connected to said pair of fault lines and an outlet issuing an output signal indicating the occurrence of faults in test operation, first and second switching transistors having sources, drains and gates, the gates of said first switching transistors each being connected to a respective one of said first bit line halves of said bit lines, and the gates of said second switching transistors each being connected to a respective one of said second bit line halves of said bit lines, the sources of all of said switching transistors being commonly connected to a potential corresponding to one of two mutually-complementary logic levels carried by said pair of fault lines in test operation, the drains of said second switching transistors being connected to said first fault line, and the drains of said first switching transistors being connected to said second fault line.

2. Circuit configuration according to claim 1, wherein said potential connected to the source of each of said switching transistors is equal to a reference potential of the circuit configuration.

3. Circuit configuration according to claim 1, wherein the potential connected to the source of each of said switching transistors is equal to a supply potential of the circuit configuration.

4. Circuit configuration according to claim 1, wherein said precharging device includes an RS flip-flop circuit having two mutually-complementary outputs, and further switching transistors connected between said outputs of said RS flip-flop circuit and said pair of fault lines.

5. Circuit configuration according to claim 1, wherein said comparator circuit is an XOR-circuit.

6. Circuit configuration according to claims 1, wherein said comparator circuit is an XNOR-circuit.

7. Method of testing storage cells disposed in a matrix in a semiconductor memory including word lines and bit lines for driving the storage cells, and evaluator circuits each dividing a respective one of the bit lines into two identical bit line halves, which comprises:
   charging all of the storage cells connected to a word line to an equal logic level in test operation;
   precharging a pair of fault lines to two mutually-complementary logic levels being identical with respect to their significance to logic levels which can be input into the storage cells in the form of electric charges;
   activating a word line for transferring a charge stored in the storage cells connected to the word line to the respective associated bit line halves;
   evaluating and amplifying the read-out charges with the evaluator circuits, and forming logic levels assigned to the read-out charges;
   driving and switching switching means connected between the bit line halves and the fault lines into conductivity or blocking with the logic levels;
   retaining the logic state of the two fault lines or changing the logic state of one of the fault lines depending upon the switching characteristics of the switching means; and
   checking whether or not the fault lines retain the mutually-complementary logic levels impressed by the precharging step upon read-out and evaluation of the charges of the storage cells with a comparator circuit connected to the fault lines.

8. Method according to claim 7, which comprises carrying out the precharging step by precharging outputs of an RS flip-flop connected to the fault lines through further switching means, and subsequently disconnecting the outputs of the RS flip-flop from the fault lines with the further switching means.

9. Method according to claim 7, which comprises carrying out the checking step with an XOR-circuit forming the comparator circuit.

10. Method according to claim 7, which comprises carrying out the checking step with an XNOR-circuit forming the comparator circuit.

11. Method according to claim 7, which comprises assigning the logic levels to the two fault lines in such a way that the fault line connected through the switching means to the storage cells to be tested in a test cycle has a logic level complementary to the logic level assigned to the storage cells which are to be tested in the form of stored charges, in the case of "no fault".

12. Method according to claim 7, which comprises assigning the logic levels to the two fault lines in such a way that the fault line connected through the switching means to the storage cells to be tested in a test case has a logic level equal to the logic level assigned to the storage cells which are to be tested in the form of stored charges, in the case of "no fault".

* * * * *